(12) United States Patent
Shen

(10) Patent No.: US 6,225,691 B1
(45) Date of Patent: May 1, 2001

(54) INTEGRATED CIRCUIT PACKAGING STRUCTURE

(75) Inventor: Ming-Tung Shen, Taipei (TW)

(73) Assignee: CTS Computer Technology System Corporation, Taipei (TW)

( * ) Notice: Subject to any disclaimer, the term of this patent is extended or adjusted under 35 U.S.C. 154(b) by 0 days.

(21) Appl. No.: 09/346,742

(22) Filed: Jul. 2, 1999

(51) Int. Cl.[7] .................................................. H01L 23/48
(52) U.S. Cl. ............................................. 257/692; 257/622
(58) Field of Search .................................. 257/692, 499, 257/510, 622, 678, 920

(56) References Cited

U.S. PATENT DOCUMENTS

| | | | |
|---|---|---|---|
| 5,032,896 | * 7/1991 | Little et al. | 357/75 |
| 5,065,277 | * 11/1991 | Davidson | 361/383 |
| 5,331,515 | * 7/1994 | Ewers | 257/692 |
| 5,473,196 | * 12/1995 | De Givry | 257/692 |
| 5,552,963 | * 9/1996 | Burns | 257/692 |
| 5,786,988 | * 6/1998 | Harari | 257/622 |
| 5,808,877 | * 9/1998 | jeong et al. | 257/692 |
| 5,821,614 | * 10/1998 | Hashimoto et al. | 257/679 |
| 6,075,280 | * 6/2000 | Yung et al. | 257/622 |
| 6,087,722 | * 6/2000 | Lee et al. | 257/692 |

* cited by examiner

*Primary Examiner*—Don Wong
*Assistant Examiner*—Thuy Vinh Tran
(74) *Attorney, Agent, or Firm*—Bacon & Thomas

(57) ABSTRACT

An integrated circuit packaging structure, which can accommodate two or four memory chips in a single package. The feature rests upon a packaging structure that makes independent data buses between two memory chips, while implementing in parallel the address buses and control buses, and finally encapsulates them within one package in the expectation of doubling the memory capacity without increasing the size of the package and the number of pins.

3 Claims, 4 Drawing Sheets

INTEGRATED CIRCUIT PACKAGING STRUCTURE

BACKGROUND OF THE INVENTION

1. Field of the Invention

The invention relates to an integrated circuit packaging structure and, in particular, to a packaging structure that can double the capacity of the memory without increasing the size of the package and the number of pins.

2. Description of the Prior Art

Memory plays a very important role in the computer mechanism. Accompanying the increasing speed of the central process unit (CPU), the memory has been prosperously developed so that, in recent years, it has overwhelmed the Moore rule, which states that the capacity will increase by a factor of four every two or three years. The capacity has rapidly evolved from 16 MB, 64 MB, 128 MB to 256 MB and is still evolving toward higher capacity.

The memory is also modularized in accord with the need of the computer industry. A usual 64 MB SDRAM module known in the prior art is composed by eight memory integrated circuits (IC), and every memory IC with 54 pins has only one memory chip. Therefore, it is indeed a waste that there is only placed on little chip in such a big package.

In observation of the disadvantages in the memory packaging structure according to the prior art that awaits for improvement, the inventor then made efforts in modifying and refining and finally succeeded in the invention of this integrated circuit packaging structure after many years of research and hard-working.

SUMMARY OF THE INVENTION

The present invention provides an integrated circuit packaging structure, which has independent implementation for the data buses among chips and parallel implementation for the address buses and control buses, and then encapsulates them into one package so as to double the capacity of the memory.

Furthermore, the instant invention provides an integrated circuit packaging structure, by which the efficiency of a memory IC can be effectively promoted and the inner space of the package can be more effectively utilized.

Yet, the invention provides an integrated circuit packaging structure, via which the capacity of the memory can be rapidly doubled and modularized, and can speed up the development of the memory industry.

The integrated circuit packaging structure with the above mentioned merits imbeds two or four memory chips into the concave structure formed by the upper and lower circuit boards, has independent data buses for each memory chip while makes address buses and control buses work in parallel, and finally encapsulates them within a single package in the expectation of enlarging the memory capacity without increasing the size of the package and the number of pins.

BRIEF DESCRIPTION OF THE DRAWINGS

The drawings disclose an illustrative embodiment of the present invention which serves to exemplify the various advantages and objects hereof, and are as follows.

Figure 1A:
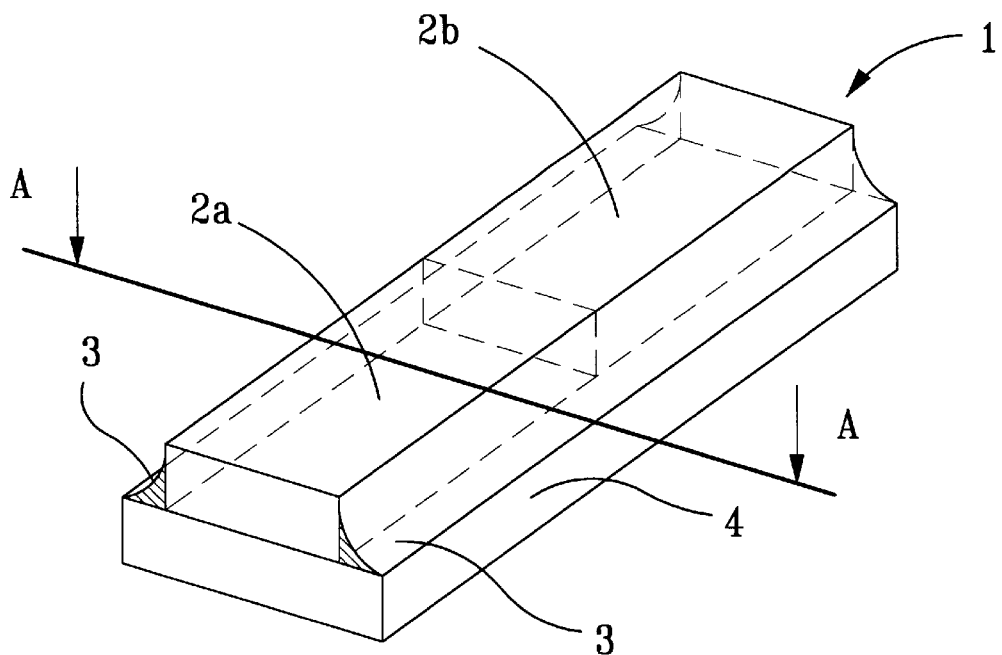
FIG. 1(A) is an embodiment of packaging two memory chips into a package according to the present invention.

Main Symbols
1 package
1a package
2a memory chip
2b memory chip
2c memory chip
2d memory chip
2e memory chip
2f memory chip
21 welding pad
21a welding pad
21b welding pad
3 upper circuit board
3a upper circuit board
31 groove
31a groove
32 welding pad
4 lower circuit board
4a lower circuit board
41 aperture
41a aperture
42 welding pad
42a welding pad
5 colloidal protection layer
5a colloidal protection layer
5b colloidal protection layer
6 connecting wire
6a connecting wire
7 punching
7a punching
8 double-sided tape

DETAILED DESCRIPTION OF THE PREFERRED EMBODIMENT

Please refer to FIG. 1(A), which is an embodiment of packaging two memory chips into a package according to the present invention. According to the diagram, two memory chips 2a, 2b are encapsulated within a package 1, and, by placing the memory chips 2a, 2b in parallel, the memory capacity doubles without enlarging the volume of the package 1.

Figure 1B:
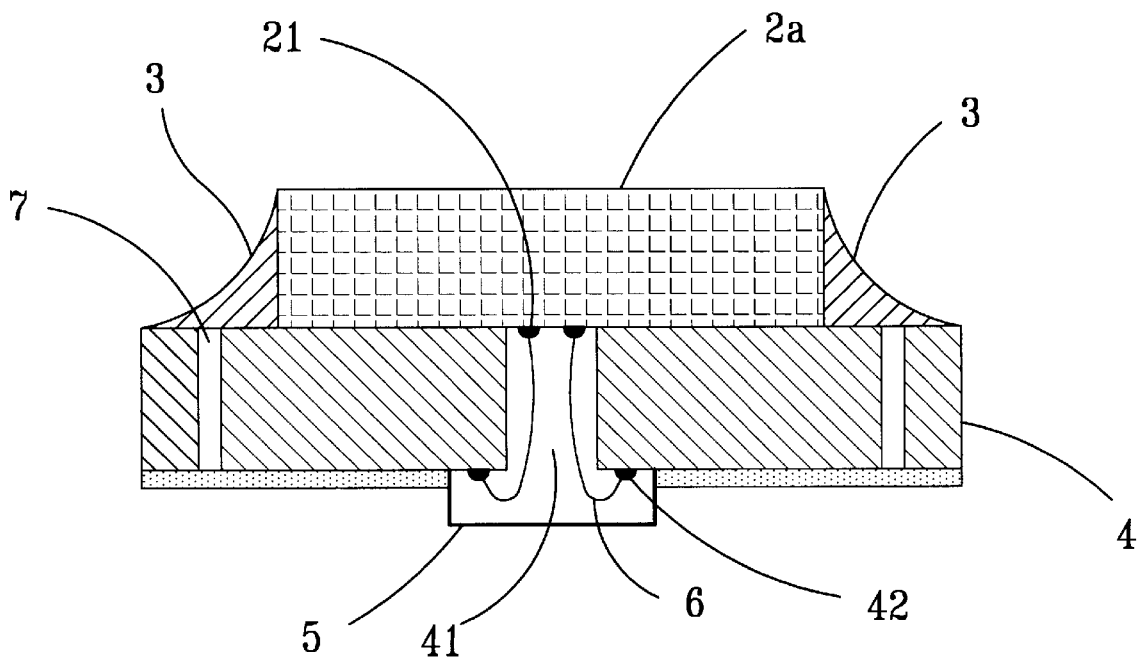
FIG. 1(B) is an A—A cross-sectional view of FIG. 1(A)

Please refer to FIG. 1(B), which is an A—A cross-sectional view of FIG. 1(A). This diagram shows the embodiment structure of the instant invention, wherein the memory chip 2a is embedded in the groove 31 formed by the upper circuit board 3 and the lower circuit board 4.

The welding pad 21 on the memory chip 2a and the welding pad 42 on the lower circuit board 4 can be connected by the bonding technique. Applying a colloidal protection layer (such as epoxy) may protect the inner connecting wire 6 and memory chip 2a. Punching 7 processes between the upper and lower circuit boards 3, 4 can make help connecting the circuits on the upper and lower circuit boards 3, 4, which is convenient for the S.M.T. process. The invention can effectively double the memory capacity via this structure.

Figure 2:
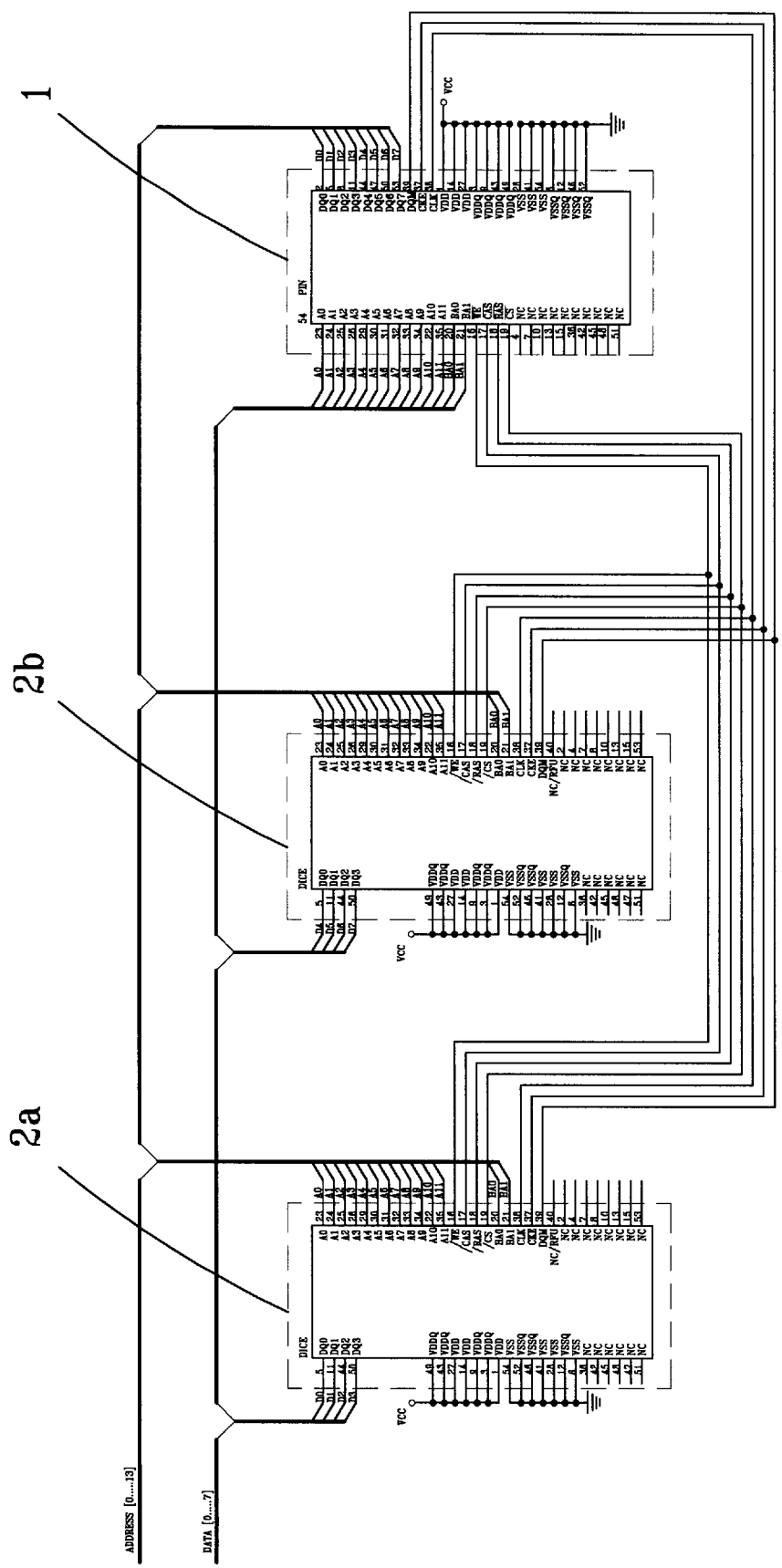
FIG. 2 is a circuit of packaging two memory chips into a package according to the present invention.

Please refer to FIG. 2, which is a circuit of packaging two memory chips into a package according to the present invention. The diagram shows that the memory chip 2a and memory chip 2b are encapsulated within the package 1, wherein the data bus (DQ0~DQ7) on the package 1 is composed by the data bus (DQ0~DQ3) on the memory chip 2a and the data bus (DQ0~DQ3) on the memory chip 2b independently; while the address bus (A0~A11, BA0, BA1) and control bus ($\overline{CS}$, $\overline{WE}$, $\overline{CAS}$, $\overline{RAS}$, CLK, CKE, DQM) on the package 1 are implemented by combining the address bus (A0~A11, BA0, BA1) and control bus ($\overline{CS}$, $\overline{WE}$, $\overline{CAS}$, $\overline{RAS}$, CLK, CKE, DQM) in parallel. Applying this circuit to the packaging structure described in FIG. 1(B) can make a memory IC with doubled memory capacity.

Figure 3A:
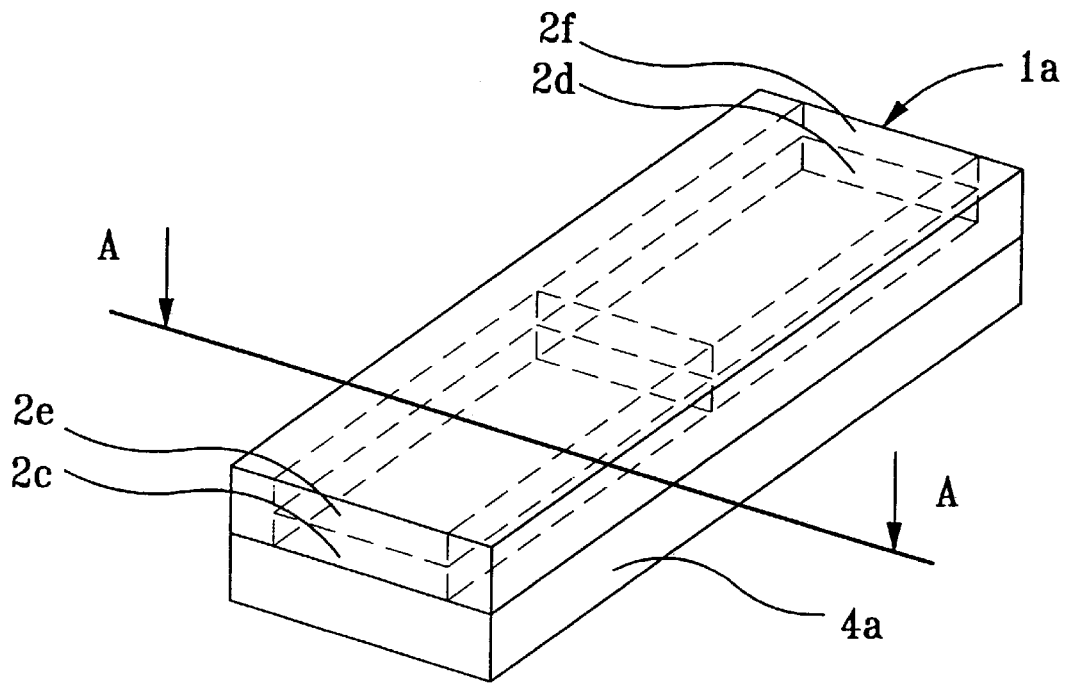
FIG. 3(A) is an embodiment of packaging four memory chips into a package according to the present invention.

Please refer to FIG. 3(A), which is an embodiment of packaging four memory chips into a package according to the present invention. The most difference between this diagram and FIG. 1(A) is to encapsulate four memory chips 2a, 2b, 2c, and 2d into a package 1a, and, by putting the memory chips 2a, 2b, 2c, and 2d in parallel and in stack, the memory capacity can be increased by a factor of four without enlarging the volume of the package 1a.

Figure 3B:
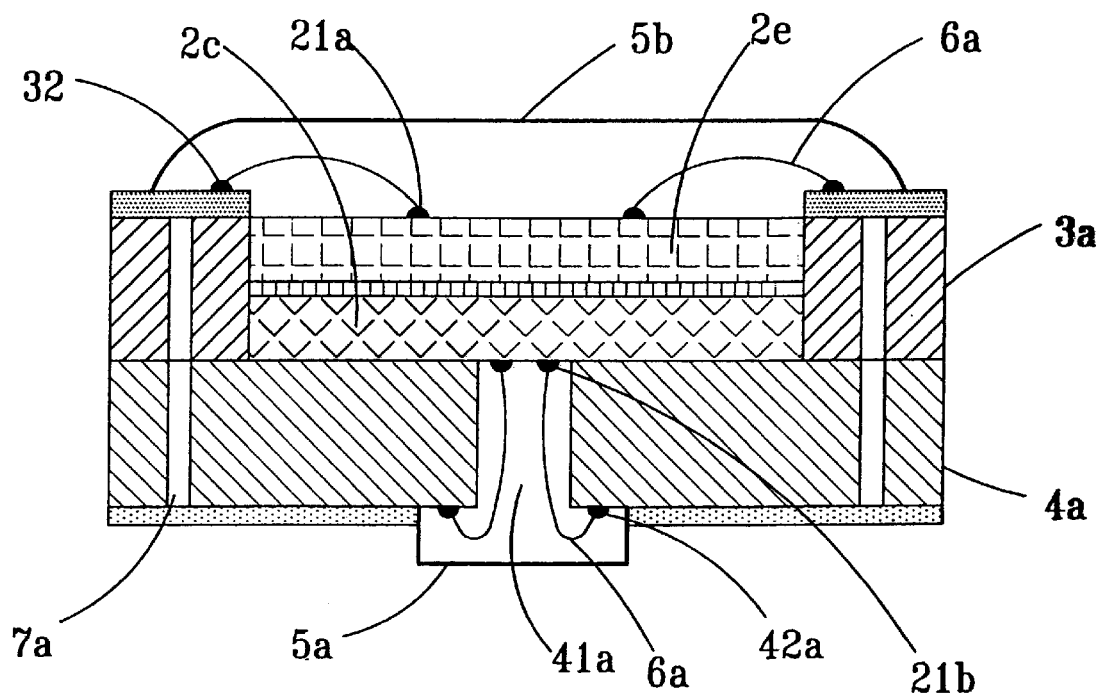
FIG. 3(B) is an A—A cross-sectional view of FIG. 3(A)

Please refer to FIG. 3(B), which is an A—A cross-sectional view of FIG. 3(A). According to the diagram, the backs of the upper and lower memory chips 2e, 2c are glued together by the double-sided tape 8, and are, stacked as double layers, embedded into the groove 31a formed by the upper circuit board 3a and the lower circuit board 4a. The welding pad 21a on the upper memory chip 2e and the welding pad 32 on the upper circuit board 3a are connected via the bonding technique, while the welding pad 21b on the lower memory chip 2c may be exposed in the aperture 41a on the lower circuit board 4a, and the welding pad 21b on the lower memory chip 2c and the welding pad 42a on the lower circuit board 4a may be connected via the bonding technique too. Applying colloidal protection layers 5a, 5b (such as epoxy) on both ends of the bonded elements can protect the inner connecting wire 6a and the memory chips 2e, 2c. Punching 7a processes between the upper and lower circuit boards 4a, 4b help connecting the circuits on the upper and lower circuit boards 4a, 4b, which in turn is convenient for the S.M.T. process. This invention can effectively increase the memory capacity by a factor of four with the help of this structure.

Figure 4:
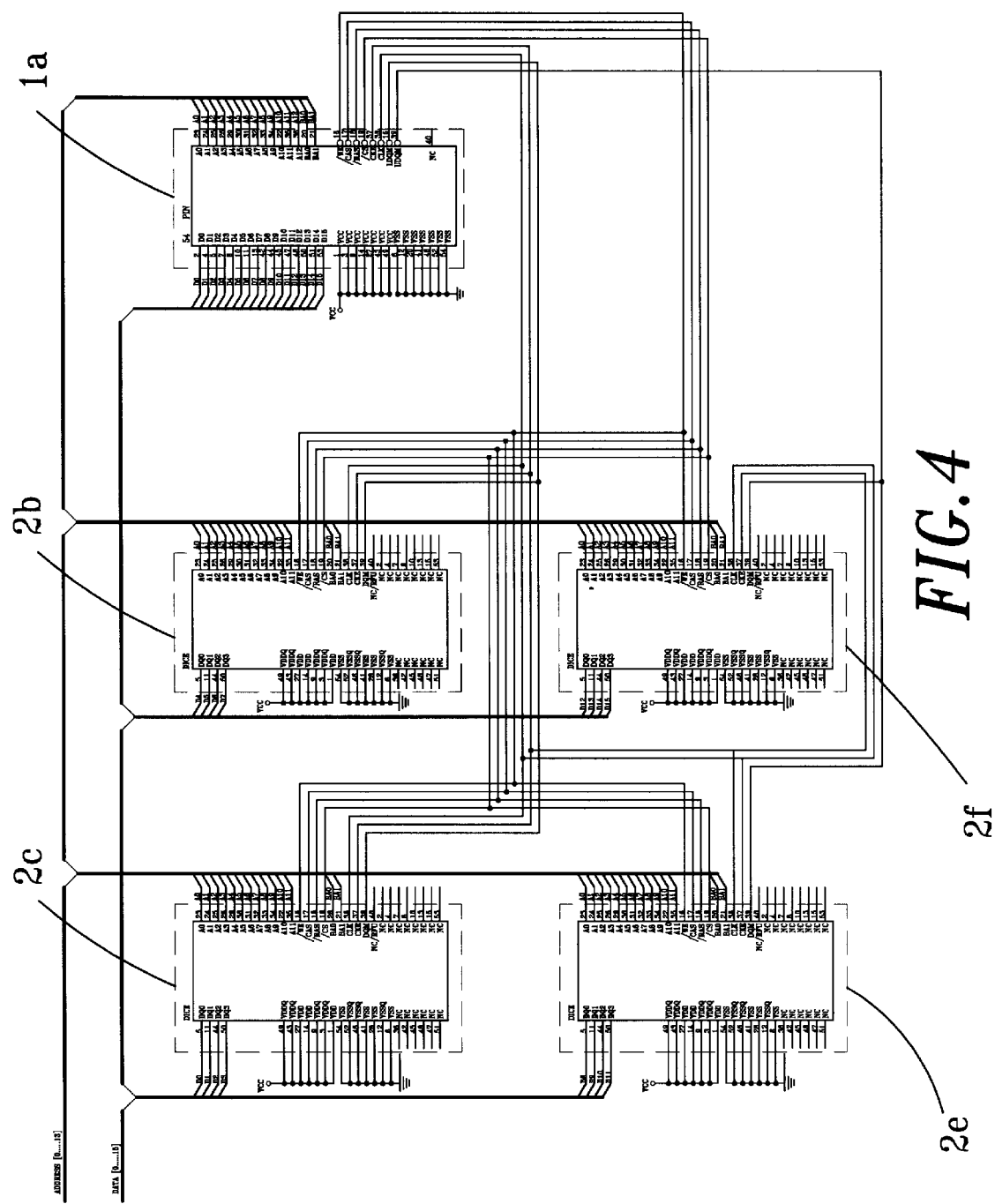
FIG. 4 is a circuit of packaging four memory chips into a package according to the present invention.

Please refer to FIG. 4, which is a circuit of packaging four memory chips into a package according to the present invention. The diagram demonstrates that the memory chips 2c, 2d, 2e, and 2f are encapsulated into a package 1a with 54 pins, wherein the data bus (DQ0~DQ15) on the package 1a are composed by the data bus (DQ)~DQ3) on each of the memory chips 2a, 2b, 2c, and 2d independently, while the address bus (A0~A11, BA0, BA1) and control bus ($\overline{CS}$, $\overline{WE}$, $\overline{CAS}$, $\overline{RAS}$, CLK, CKE, LDQM, UDQM) on the package 1a are implemented by putting the address bus (A0~A11, BA0, BA1) and control bus ($\overline{CS}$, $\overline{WE}$, $\overline{CAS}$, $\overline{RAS}$, CLK, CKE, DQM) on each of the memory chips 2a, 2b, 2c, and 2d in parallel. Applying this circuit feature to the packaging structure described in FIG. 3(B) can produce a memory IC with four times of memory capacity.

The integrated circuit packaging structure provided by the instant invention, when compared with the prior art, has the following merits:

1. the integrated circuit packaging structure according to the invention can encapsulate two memory chips into a single package and thus enlarges the memory capacity by a factor of two or four without increasing the size of the package and the number of pins;
2. the integrated circuit packaging structure according to the invention can effectively promote the efficiency of a memory IC, and can make good use of the inner space of the package; and
3. the integrated circuit packaging structure according to the invention can effectively double and modularize the memory, which can stimulate rapid development in memory industry.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. An integrated circuit packaging structure including at least two dice, the address bus of one of the dice being connected electrically to the address bus of the other one of the dice, while the control bus of one of the dice is connected electrically to the control bus of the other one of the dice, the integrated circuit packaging structure further comprising:

a printed circuit board unit having a top surface formed with a plurality of electrical traces, a plurality of bonding pads provided on the top surface and connected electrically to a corresponding one of the electrical traces, and an aperture formed therethrough;

each of the dice having an upper surface and a plurality of bonding pads formed on the upper surface, the upper surface of each of the dice being attached to a bottom surface of the printed circuit board unit such that the bonding pads of the dice are registered with the aperture; and a plurality of conductive wires interconnecting the bonding pads of the dice and the bonding pads of the printed circuit board unit through the aperture.

2. An integrated circuit packaging structure as claimed in claim 1, further comprising an encapsulation layer formed on the bottom surface of the printed circuit board unit around the dice.

3. An integrated circuit packaging structure as claimed in claim 1, wherein the printed circuit board unit includes superimposed upper and lower printed circuit boards, the upper printed circuit board having a top surface which serves as the top surface of the printed circuit board unit, and a bottom surface, the lower printed circuit board having a top surface attached to the bottom surface of the upper printed circuit board, a bottom surface on which a plurality of bonding pads are provided, and a hole formed therethrough, the lower printed circuit board further having an inner peripheral wall which confines the hole, the inner peripheral wall of the lower printed circuit board and the bottom surface of the upper printed circuit board cooperatively defining therebetween a die-receiving cavity in which the dice are received, the integrated circuit packaging structure further comprising:

at least two second dice, each of which being received in the die-receiving cavity and having a bottom surface attached to a bottom surface of a corresponding one of the first dice, each of the second dice further having a top surface on which a plurality of bonding pads are mounted; and a plurality of second conductive wires interconnecting the bonding pads of the second dice and the bonding pads of the lower printed circuit board.

* * * * *